United States Patent [19]

Lysenko et al.

[11] Patent Number: 5,091,500
[45] Date of Patent: Feb. 25, 1992

[54] POLYBENZAZOLE POLYMER CONTAINING PERFLUOROCYCLOBUTANE RINGS

[75] Inventors: Zenon Lysenko; William J. Harris, both of Midland, Mich.

[73] Assignee: The Dow Chemical Company, Midland, Mich.

[21] Appl. No.: 588,127

[22] Filed: Sep. 21, 1990

[51] Int. Cl.$^5$ .............................................. C08G 73/06
[52] U.S. Cl. .................................... 528/183; 528/125; 528/128; 528/171; 528/172; 528/185; 528/186; 528/226; 528/229; 528/337; 528/342
[58] Field of Search ............... 528/183, 185, 186, 125, 528/128, 171, 172, 226, 229, 337, 342

[56] References Cited

U.S. PATENT DOCUMENTS

| 4,064,109 | 12/1977 | Evers | 260/61 |
| 4,115,367 | 12/1978 | Evers | 528/210 |
| 4,147,858 | 4/1979 | Evers | 528/210 |
| 4,533,692 | 8/1985 | Wolfe | 524/417 |
| 4,533,693 | 8/1985 | Wolfe | 524/417 |
| 4,533,724 | 8/1985 | Wolfe | 528/179 |
| 4,703,103 | 10/1987 | Wolfe | 528/179 |
| 4,772,678 | 9/1988 | Sybert | 528/179 |
| 4,845,183 | 7/1989 | Mueller | 528/185 |

FOREIGN PATENT DOCUMENTS 9003995  4/1990  PCT Int'l Appl. .

OTHER PUBLICATIONS

11 Ency. Poly. Sci. & Eng. *Polybenzothiazoles and Polybenzoxazoles*, 601 (J. Wiley & Sons 1988).

*Primary Examiner*—Harold D. Anderson

[57] ABSTRACT

Polybenzazole polymers contain perfluorocyclobutane rings to provide a flexible moiety which is stable at high temperatures.

20 Claims, No Drawings

POLYBENZAZOLE POLYMER CONTAINING PERFLUOROCYCLOBUTANE RINGS

STATEMENT OF GOVERNMENT INTEREST

This invention was made with Government support under contract F33615-86-C-5068 awarded by the Department of the Air Force. The Government has certain rights in this invention.

BACKGROUND OF THE INVENTION

The invention relates to the art of polybenzazole polymers.

Polybenzazole (PBZ) polymers are well-known and described in numerous literature references, such as 11 Encyclopedia of Poly. Sci & Eng., *Polybenzothiazoles and Polybenzoxazoles*, 601 (1988), which is incorporated herein by reference. Mer units in polybenzazole polymers are ordinarily either AB-units, as illustrated in Formula 1(a) or AA/BB-mer units, as illustrated in Formula 1(b):

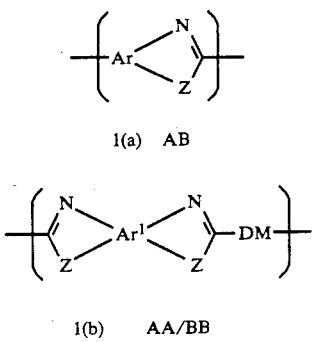

1(a) AB

1(b) AA/BB wherein:
each Ar is an aromatic group,
DM is a divalent organic moiety which is stable and inert in acid under polymerization conditions, and
each Z is independently an oxygen atom, a sulfur atom, or a nitrogen atom that is bonded to a hydrogen atom or an organic moiety which is stable and inert in acid under polymerization conditions.

(For the purpose of this application, when the nitrogen atoms and Z moieties of a mer unit are depicted as bonded to an aromatic group without indicating their position, as in Formulae 1(a)–(b), it shall be understood that:

(1) each nitrogen atom and Z group within a given azole ring are bonded to the aromatic group in ortho position with respect to each other: and (2) if the mer unit has two azole rings, one nitrogen atom and Z moiety may be in either cis position or trans position with respect to the other nitrogen atom and Z moiety, for example illustrated in 11 Ency. Poly. Sci. & Eng., supra, at 602, which is incorporated herein by reference.The same understandings apply with respect to amine groups and Z moieties in a BB-monomer.)

Polybenzazole polymers may be rigid rod or semi-rigid polymers which can sometimes form liquid crystalline dopes in solvent acids. Such polymers are noted for their high thermal stability and resistance to common organic solvents. However, the polymers are frequently difficult to fabricate into a useful article because they are not always thermoplastic, they are often insoluble in common organic solvent, and they are incompatible with many thermoplastic polymers.

Polybenzazole polymers have been modified by placing flexible moieties in the polymer backbone, in order to render the polymers thermoplastic or compatible with other polymers. However, many common flexible moieties which are put into polybenzazole polymers lower the thermal stability or solvent resistance of the polymer.

What are needed are polybenzazole polymers containing flexible moieties which have high thermal stability and/or solvent resistance.

SUMMARY OF THE INVENTION

The present invention is a polybenzazole polymer containing perfluorocyclobutane rings in the polymer backbone. The perfluorocyclobutane ring adds flexibility to the polymer chain, and has a high thermal stability. The polymer may be fabricated into fibers, films or other shaped articles which are useful as structural materials or electronic substrates.

DETAILED DESCRIPTION OF THE INVENTION

Definitions

The following terms are used repeatedly throughout this application, and have the meaning and preferred embodiments defined herein unless otherwise specified.

AA-Monomer—A monomer suitable for synthesizing polybenzazole polymers, oomprising two electron-deficient carbon groups linked by a divalent organic moiety (DM) which does not interfere with the polymerization, fabrication or use of the resulting polymer The electron-deficient carbon groups have the definition and preferred embodiments given herein. The divalent organic moiety is preferably alkyl or an aromatic group, as herein defined, is more preferably an aromatic group, and is most preferably a six-membered aromatic group. Examples of suitable AA-monomers and references to their synthesis are provided in U.S. Pat. No. 4,533,693 at col. 25–32, Tables 4–6, which is incorporated herein by reference. Preferred examples of AA-monomers include terephthalic acid, isophthalic acid, bis-(4-benzoic) acid and oxy-bis-(4-benzoic acid) and acid halides thereof.

In polymers of the present invention, at least some of the AA-monomers contain a perfluorocyclobutane moiety. Such AA-monomers preferably contain aryloxy moieties bonded to the 1- and 2-carbons of the perfluorocyclobutane ring and electron-deficient carbon groups bonded to each aryloxy moiety. Such AA-monomers are described in greater detail hereinafter.

AB-Monomer - A monomer suitable for synthesizing polybenzazole polymers, comprising an aromatic group, an o-amino-basic moiety bonded to the aromatic group, and an electron-deficient carbon group bonded to the aromatic group. The aromatic group, the electron-deficient carbon group and the o-amino-basic moiety have the definitions and preferred embodiments given herein. Examples of suitable AB-monomers and processes for their synthesis are provided in U.S. Pat. No. 4,533,693 at col. 33–35, Tables 7–8, which is incorporated herein by reference. Preferred examples of AB-monomers include 3-amino-4-hydroxybenzoic acid, 3-hydroxy-4-aminobenzoic acid and the acid halides thereof. AB-monomers are frequently stored as salts of hydrogen chloride or phosphoric acid, because the free-base of the monomer is unstable and often susceptible to air oxidation.

o-Amino-basic moiety—a moiety, which is bonded to an aromatic group, consisting of
(1) a primary amine group bonded to the aromatic group and
(2) a hydroxy, thiol or primary or secondary amine group bonded to the aromatic group ortho to said primary amine group.

It preferably comprises a hydroxy, thiol or primary amine moiety, more preferably comprises a hydroxy or thiol moiety, and most preferably comprises a hydroxy moiety. Secondary amine groups comprise an aromatic or an aliphatic group and preferably an alkyl group. The secondary amine group preferably comprises no more than about 6 carbon atoms, more preferably no more than about 4 carbon atoms and most preferably no more than about 1 carbon atom.

Aromatic group (Ar)—any aromatic ring or ring system. Size is not critical as long as the aromatio group is not so big that it prevents further reactions of the moiety in which it is incorporated. Each aromatic group independently preferably comprises no more than about 18 carbon atoms, more preferably no more than about 12 carbon atoms and most preferably no more than about 6 carbon atoms. Each may be heterocyclic but is preferably carbooyclic and more preferably hydrocarbyl. If the aromatic group is heterocyclic, the heteroatom is preferably nitrogen.

Unless otherwise specified, each aromatic group may comprise a single aromatic ring, a fused ring system or an unfused ring system containing two or more aromatic moieties joined by bonds or by divalent moieties (X) which are inert with respect to PBZ polymerizing reagents under polymerization conditions. Suitable divalent moieties comprise, for example, a carbonyl group, a sulfonyl group, an oxygen atom, a sulfur atom, an alkyl group and/or an or a perfluorinated alkyl group. Each aromatic group is preferably a single six-membered ring.

Each aromatic group may contain substituents which are stable in solvent acid and do not interfere with further reactions of the moiety which the aromatic group is part of. Examples of preferred substituents include halogens, alkoxy moieties, aryloxy moieties or alkyl groups. More preferred substituents are either an alkyl group having no more than about 6 carbon atoms or a halogen. Most preferably, each aromatic group contains only those substituents specifically called for hereinafter.

Azole ring—an oxazole, thiazole or imidazole ring. The carbon atom bonded to both the nitrogen atom and the oxygen, sulfur or second nitrogen atom is the 2-carbon, as depicted in Formula 2

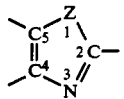

2 wherein Z is —O—, —S— or —NR—; and R is hydrogen, an aromatic or an aliphatic group, preferably hydrogen or an alkyl group, and most preferably hydrogen. R preferably comprises no more than about 6 carbon atoms, more preferably no more than about 4 and most preferably no more than about 1. Each azole ring is independently preferably oxazole or thiazole and more preferably oxazole. In PBZ polymers, the 4- and 5-carbon of each azole ring is ordinarily fused with an aromatic group.

BB-Monomer—A monomer suitable for synthesizing polybenzazole polymers, comprising an aromatic group and two o-amino-basic moieties which are bonded to the aromatic group. The aromatic group and the o-amino-basic moieties have the definitions and preferred embodiments given herein. Examples of suitable BB-monomers and processes for synthesis are provided in U.S. Pat. No. 4,533,693 at col. 19–24, Tables 15 1-3, which is incorporated herein by reference. Examples of preferred BB-monomers include 4,6-diaminoresorcinol, 2,5-diaminohydroquinone, bis-(3-amino-4-hydroxyphenyl)-sulfone and 1,4-dithio-2,5-diamino-benzene. BB-monomers are frequently stored as salts of hydrogen chloride or phosphoric acid, because the free base of the monomer is susceptible to air oxidation.

Electron-deficient carbon group (Q)—any group containing a carbon atom which can react in the solvent acid with an o-amino-basic moiety to form an azole ring, such as the groups listed in col. 24, lines 59–66 of the 4,533,693 patent, which is incorporated herein by reference. Preferred electron-deficient carbon groups are carboxylic acids, acid halides, metal carboxylate salts, cyano groups and trihalomethyl groups. Halogens in electron-deficient carbon groups are preferably chlorine, bromine or iodine and more preferably chlorine.

Polybenzazole (PBZ) polymer—A polymer from the group of polybenzoxazoles and polybenzobisoxazoles (PBO), polybenzothiazoles and polybenzobisthiazoles (PBT) and polybenzimidazoles or polybenzobisimidazoles (PBI). For the purposes of this application, the term "polybenzoxazole (PBO)" refers broadly to polymers in which each mer unit contains an oxazole ring bonded to an aromatic group, which need not necessarily be a benzene ring. The term "polybenzoxazole (PBO)" also refers broadly to poly(phenylene-benzobis-oxazole)s and other polymers wherein each mer unit comprises a plurality of oxazole rings fused to an aromatic group. The same understandings shall apply to the terms polybenzothiazole (PBT) and polybenzimidazole (PBI).

Solvent acid—any non-oxidizing liquid acid capable of dissolving PBZ polymers, such as sulfurio acid, methanesulfonic acid, trifluoromethylsulfonic acid, polyphosphoric acid and mixtures thereof. It must be sufficiently non-oxidizing that it does not substantially oxidize AB- and BB-PBZ monomers which are dissolved therein. Solvent acids are preferably dehydrating acids, such as polyphosphoric acid or a mixture of methanesulfonic acid and phosphorus pentoxide. Preferred concentrations of $P_2O_5$ in the methanesulfonic acid are described in U.S. Pat. Nos. 4,847,350 and 4,722,678, which are incorporated by reference. Concentrations of $P_2O_5$ in the polyphosphoric acids are described in U.S. Pat. Nos. 4,533,693 and 4,722,678, which are incorporated by reference. When the solvent acid is polyphosphoric acid, it may contain as little as 77 percent $P_2O_5$ or less at the commencement of the reaction. It preferably contains at least about 80 weight percent $P_2O_5$ at the commencement of the reaction, more preferably at least about 85 weight percent and most preferably 87 weight percent and preferably has a $P_2O_5$ content of at most about 90 percent, more preferably at most about 88 percent.

MONOMERS USEFUL IN THE PRESENT INVENTION

Polymers of the present invention are synthesized by the reaction of AA- and BB-monomers, optionally with AB-monomers, as those monomers are previously described. At least some of the AA-monomers must contain perfluorocyclobutane rings.

AA-monomers containing perfluorocyclobutane rings preferably comprise:
(1) a perfluorocyclobutane ring:
(2) two oxygen or sulfur atoms bonded to different carbon atoms of the perfluorocyclobutane ring:
(3) two aromatic groups, one bonded to each oxygen or sulfur atom: and
(4) two electron-deficient carbon groups, one bonded each aromatic group.

The AA-monomers are preferably represented by the Formula:

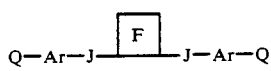    2 wherein:
each J is an oxygen or sulfur atom:
each Ar is an aromatic group:
each Q is an electron-deficient carbon group: and
the capital F in within the cyclobutane ring indicates that the ring is perfluorinated.

Each oxygen or sulfur atom (J) is preferably an oxygen atom. The oxygen or sulfur atoms are preferably bonded to adjacent carbon atoms, i.e., in 1,2-position.

Each aromatic group (Ar) has the meaning and preferred embodiments previously defined. It is most preferably a phenylene moiety.

Each electron-deficient carbon group is preferably bonded to the aromatic group either meta or para to the oxygen or sulfur atom and more preferably para to the oxygen or sulfur atom. Examples of highly preferred AA-monomers include 1,2-bis-(oxy-4-benzoic acid)-perfluorocyclobutane: 1,2-bis-(oxy-3-benzoic acid)-perfluorocyclobutane and esters and acid halides thereof.

The monomers are synthesized by a three-step process from a lower ($C_1$–$C_6$) alkyl hydroxy-benzoate ester. Certain lower alkyl hydroxy-benzoate esters are commercially available, such as methyl 3-hydroxybenzoate and methyl 4-hydroxybenzoate. Others can be synthesized by known processes.

In the first step of monomer synthesis the hydroxybenzoate ester reacts with 1,2-dibromo-tetrafluoroethane in an organic solvent in the presence of a strong base such a sodium hydroxide, such that a substituted phenoxy-(or phenylthio-)-2-bromotetrafluoroethane is formed.

In the second step, the product of step 1 reacts with zinc to form a substituted phenoxy-(or phenylthio)-trifluoro-ethene moiety. The first two steps and their conditions are described in Chambers, Fluorine in Organic Chemistry 97–200 (J. Wiley & Sons 1973), which is incorporated herein by reference.

In the third step, two equivalents of the product of step 2 are heated under conditions such that the trifluoroethene moieties react to form a single equivalent of diester containing a perfluorocyclobutane moiety. The reaction is ordinarily carried out at about 180° C. The entire synthetic scheme is preferably represented by Formula 5

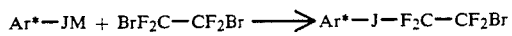   5

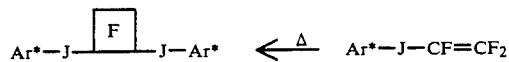

wherein each Ar* is an activated aromatic group having a substituent as previously described.

The diester resulting from step 3 can be used as an AA-monomer, for instance, as described in U.S. Pat. No. 4,608,427, which is incorporated herein by reference. Alternatively, the diester may be converted into other AA-monomers by known processes. For instance, the diester can be converted to the diacid by saponification, as described in Loudon, supra, at 1055–57, which is incorporated herein by reference. The diacid can be used as an AA-monomer or converted to the corresponding acid halide by reaction with thionyl chloride or phosphorus pentachloride, as described in Loudon, supra. at 1014, which is incorporated herein by reference.

POLYMERS OF THE PRESENT INVENTION

The monomers previously described can be used to make polymers which contain benzazole moieties and perfluorocyclobutane moieties.

The polymers are synthesized in the ordinary manner for polybenzazole polymers, by the reaction of approximate equimolar amounts at least one AA-monomer, containing two electron-deficient carbon groups, and at least one BB-monomer, containing two o-amino-basic moieties At least some of the AA-monomers must contain perfluorocyclobutane moieties as previously described.

Other suitable monomers are described in numerous references, such as U.S. Pat. No. 4,533,693, which is incorporated herein by reference. Suitable BB-monomers may be, for example: 4,6-diaminoresorcinol: 2,5-diaminohydroquinone; 1,4-dithio-2,5-diaminobenzene: 1,2,4,5-tetraminobenzene, bis-(3-amino-4-hydroxyphenyl)sulfone or an acid salt thereof. AA-monomers which do not contain perfluorocyclobutane moieties may be, for example: terephthalic acid, isophthalic acid, bis-(4-benzoic acid) sebacic acid, or an acid halide or ester thereof.

The reaction mixture may contain several variations which will be apparent to persons of ordinary skill in the art. All AA-monomer within the reaction mixture may contain perfluorocyclobutane moieties, or the reaction mixture may contain both AA-monomers with perfluorocyclobutane moieties and AA-monomers without perfluorocyclobutane moieties. The proportions of those AA-monomers may be varied to provide a greater or lesser degree of flexibility within the polymer chain. The reaction mixture may contain AB-monomers, as well as AA- and BB-monomers. The BB-monomers may be a single monomer or a mixture of different BB-monomers. The reaction mixture may also contain a small quantity of monofunctional reagents to limit the molecular weight of the polymer and cap the ends of the polymer as described in U.S. Pat. No. 4,703,103, which is supported herein by reference. The stoichiometry of the AA- and BB-monomers may be offset to provide a polymer or oligomer which is capped by a particular end group and may subsequently be incorporated into block copolymers.

group. X is most preferably a sulfonyl group. The mer units are most preferably represented by the formula:

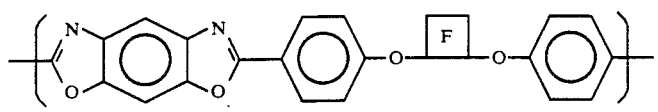

The monomers are polymerized in non-oxidizing, dehydrating solvent acid such as polyphosphoric acid under an inert atmosphere such as nitrogen or vacuum with mixing. The solvent acid may contain solvent additives, suoh as sulfolane, to facilitate the dissolution of monomers and/or maintain the resulting polymer in solution, so that higher molecular weight may be obtained. The temperature of the reaction is ordinarily about 50° C.-100° C. at the commencement of the reaction and is increased in a step-wise or ramped fashion during the reaction to a maximum of about 190° C.--220° C. Hydrogen chloride associated with BB-monomers, and sometimes the AA-monomers, is typically driven off at the beginning of the reaction.

The resulting polymer has a plurality of repeating moieties which contain a 1,2-perfluorocyclobutane moiety. The perfluorocyclobutane moiety is joined to the remainder of the polymer by either oxygen atoms or sulfur atoms, which are preferably bonded to the 1 and 2 carbon atoms of the perfluorocyclobutane ring. Mer units containing perfluorocyclobutane moieties are preferably represented by the formula:

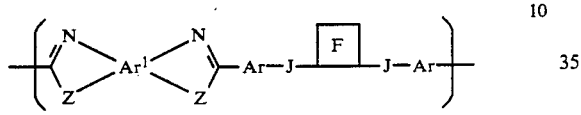

wherein Ar and $Ar^1$ are di- and tetrafunctional aromatic groups: and all other moieties have the meanings previously assigned.

Ar and $Ar^1$ have the meanings and preferred embodiments previously described for aromatic groups. Each Ar is preferably a meta- or para-phenylene moiety and more preferably a para-phenylene moiety. Each $Ar^1$ is most preferably a 1,2,4,5-phenylene moiety.

The mer units are more preferably represented by one of the Formulae

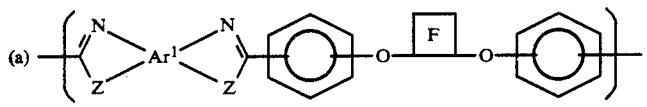

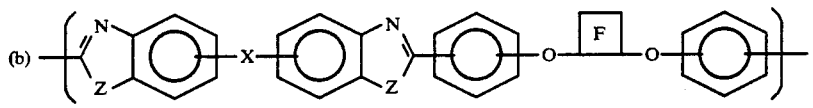

wherein $Ar^1$ is a tetravalent six-membered ring: X is a bond or a divalent moiety which does not interfere with the synthesis, fabrication or use of the polymer; and Z has the meaning previously given. X is preferably a bond, an oxygen atom, a sulfonyl group, a carbonyl group: an alkyl group or a perfluorinated alkyl group. X is more preferably a bond, an oxygen atom or a sulfonyl The polymer may contain other mer units, both AA/BB- and AB-mer units, as those units are previously described. Divalent organic moieties (DM) in those mer units may be alkyl or perfluorinated alkyl, but they are preferably aromatic groups: more preferably phenylene, biphenylene or diphenylene ether groups and most preferably p-phenylene groups. Suitable mer units may be any described for polymers in U.S. Pat. No. 4,533,693, which is incorporated herein by reference. Examples of preferred mer units which do not contain perfluorocyclobutane rings are represented by the following Formulae:

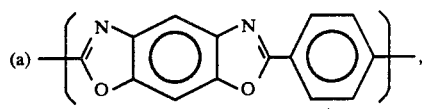

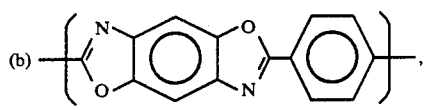

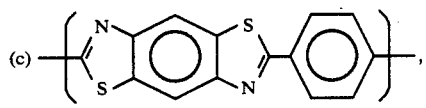

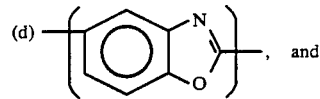

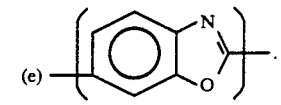

wherein each Z is an oxygen or a sulfur atom. The mer units represented by 12(a) and (b) are more preferred, and the mer unit represented by 12(a) is most preferred.

The polymer preferably contains at least 25 mer units, more preferably at least about 50 mer unit and most preferably about 100 mer unit. However, shorter segments, such as containing at least 5 or 10 mer units may be useful in block copolymers. Such block copolymers preferably contain rigid or non-rigid PBZ polymer blocks interspersed with blocks containing perfluorocyclobutane moieties. Polybenzazole polymers containing perfluorocyclobutane may also be made a part of random or block copolymers with polyamides, polyimides, polyquinoxalines, polyquinolines, poly(aromatic ethers) or copolymers thereof, as described in Harris et al., *Copolymers Containing Polybenzoxazole, Polybenzothiazole and Polybenzimidazole Moieties*, International Application No. PCT/US89/04464 (filed October 6, 1989), International Publication No. WO 90/03995 (published April 19, 1990) and in U.S. patent application Ser. No. 407,973 (filed Sept. 15, 1989), which are incorporated herein by reference.

Within the polymer, between 1 and 100 percent of the mer units may contain perfluorocyclobutane moieties. Preferably at least about 5 percent of the mer units contain perfluorocyclobutane moieties, more preferably at least about 10 percent do, more highly preferably at least about 25 percent do, and most preferably at least about 50 percent do.

Polymers containing perfluorocyclobutane moieties have several desirable properties. They are ordinarily thermoplastic and can be shaped at a temperature above their glass-transition temperatures. They also have good temperature stability. It is also theorized that the polymer structure is suitable for membranes having good gas permeability and selectivities. It is theorized that the perfluorocyclobutane group can lead to materials having low dielectric constants that are useful in electronics applications.

The polymers of the present invention are advantageously illustrated by the following illustrative Examples.

ILLUSTRATIVE EXAMPLES

The following examples are for illustrative purposes only, and should not be taken as limiting the scope of either the specification or the claims unless stated otherwise, all parts and percentages are by weight

EXAMPLE A—Synthesis of 1,2-bis-(4-oxybenzoic acid) perfluorocyclobutane, and ester and acid halide thereof Step 1—A mixture containing 76.1 g of methyl 4-hydroxybenzoate, 300 ml of anhydrous DMSO, 150 ml of toluene and 61.72 g of potassium t-butoxide is heated while 175 ml of toluene and t-butanol are removed by distillation in the 110° C.–165° C. temperature range. The mixture is allowed to cool to room temperature and 259 g of 1,2-dibromotetrafluoroethane is added dropwise. The mixture is maintained at 70° C. overnight, and then poured into water and stirred. The product is extracted with 1 L of methylene chloride, dried over magnesium sulfate and recovered by removing the solvent under reduced pressure. The recovered product is a light yellow oil containing 81% methyl 4-(2-bromotetrafluoroethoxy)-benzoate and 19% methyl 4-(tetrafluoroethoxy)-benzoate.

Step 2—A 228 g quantity of the product of Step 1 is added dropwise to a stirred, refluxing mixture of containing 1 L of dry dioxane and 45 g of zinc dust under nitrogen. Heating is continued for 2 hours the mixture is cooled to room temperature and then filtered. The solution is diluted with 1 L of water and extracted with four 500 ml positions of water. The organic phase is dried with magnesium sulfate, and the solvent is removed under vacuum. A 103.7 g quantity of pale yellow oil is recovered which contains 77.2 percent methyl 4-(trifluorovinyloxy)benzoate.

Step 3—A mixture of 100 g of product from Step 2 and 250 ml of 1,2,4-trichlorobenzene is heated to 200° C. for four hours. The reaction is cooled to room temperature, and the solvent and unreacted material are removed by distillation at 100° C. and 200° C. at 0.2 mmHg vacuum. The resulting clear colorless oil solidified on standing and is recrystallized from hexane. The recovered product is a 45 g quantity of E,Z-1,2-bis-4-(oxy-4-methylbenzoate)perfluorocyclobutane.

A mixture containing 33 g of 2-bis-(oxy-4-methylbenzoate) perfluorocyclobutane, 225 g of methanol, 125 ml of water and 17.2 g of sodium hydroxide is refused for six hours. The reaction mixture is cooled and concentrated hydrochloric acid is added to neutralize the mixture. A 37 g quantity of 1,2-bis-(oxy-4-benzoic acid) perfluorocyclobutane is recovered.

A mixture of 30 g of 1,2-bis-(oxy-4-benzoic acid) perfluorocyclobutane, 250 ml of thionyl chloride, and 5 drops of dimethyl formamide is refluxed overnight, cooled and filtered. The thionyl chloride is removed under vacuum to yield a yellow oil which solidifies on standing. The solid is recrystallized from hexane, yielding 35 g of E,Z-1,2-bis-(oxy-4-benzoyl chloride) perfluorocyclobutane.

EXAMPLE 1—Polymer from diacid

A mixture of 0.63 g of 4,6-diaminoresorcinol dihydrochloride (DAR): 1.3 g of 1,2bis-(oxy-4-benzoic acid) perfluorocyclobutane (OBPFC) and 32.7 g of polyphosphoric acid (76.2 weight percent $P_2O_5$) is agitated at 45° C. for 16 hours under nitrogen atmosphere. The temperature is raised to 95° C. and 15.6 g of $P_2O_5$ is added. The mixture is heated at 95° C. for 8 hours, 150° C. for 16 hours and 190° C. for 24 hours. The resulting polymer is precipitated in aqueous sodium hydroxide, washed with water and dried under vacuum at 100° C. The resulting polymer is represented by Formula 12.

Inherent viscosity of the polymer is measured in concentrated sulfuric acid at a concentration of 0.2 g/dL at 25.0° C. in an Ubelhobde tube having a 1.13 mm internal diameter. The inherent viscosity is 0.54 dL/g.

EXAMPLE 2—Polymer from diesters

The procedure of Example 1 is repeated using 0.64 g of DAR, 1.39 g of the dimethyl ester of OBPFC, 34.2 g of polyphosphoric acid (76.8 weight percent $P_2O_5$), and 14.6 g of $P_2O_5$. The polymer has an inherent viscosity of 0.15 dL/g.

EXAMPLE 3—Polymer via acid chloride

The procedure of Example 1 is repeated using 64 g of DAR, 1.42 g of the dichloride OBPFC, 33.4 g of polyphosphoric acid (76.2 weight percent $P_2O_5$ and 5.4 g of $P_2O_5$. The polymer has an inherent viscosity of 0.93 dL/g.

EXAMPLE 4—Polymer with acid chloride and tetramethylene sulfone

The proces of Example 1 is repeated using 0.64 g of DAR, 1.42 g of the dichloride of OBPFC, 30.6 g of polyphosphoric acid (76.7 wt % $P_2O_5$) And 13.2 g of $P_2O_5$, except that 4.9 g of tetramethylene sulfone is added along with the $P_2O_5$ and the mixture is heated at 95° C. for 24 hours, rather than for 8 hours. The resulting polymer has an inherent viscosity of 1.06 dL/g.

EXAMPLE 5—Polymer Containing Meta bonds 1,2-bis-(oxy-3-benzoic acid) perfluorocyclobutane is prepared by substituting methyl 3-hydroxybenzoate for methyl 4-hydroxybenzoate in the procedure of Example 5 A. The process of Example 1 is repeated using 1 g of DAR, 2.05 g of 1,2-bis-(oxy-3-benzoic acid) perfluorocyclobutane, a 52.8 g of polyphosphoric acid (76.7 weight percent $P_2O_5$ and 23.6 g of $P_2O_5$. The resulting polymer is represented by the Formula

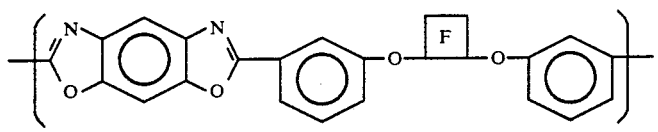

The polymer has an inherent viscosity of 0.43 dL/g and a melting temperature, measured by differential scanning calorimetry, at about 395° C.

EXAMPLE 6—Sulfone-Containing Polymer

The process of Example 4 is repeated using 1.00 g of bis-(3-amino-4-hydroxyphenyl)sulfone in place of the DAR, 1.27 g of the dichloride of OBPFC, 30.3 g of polyphosphoric acid (77.1 weight percent $P_2O_5$), 20.2 g of $P_2O_5$ and 5.6 g of tetramethylene sulfone. The resulting polymer has a structure represented by the Formula:

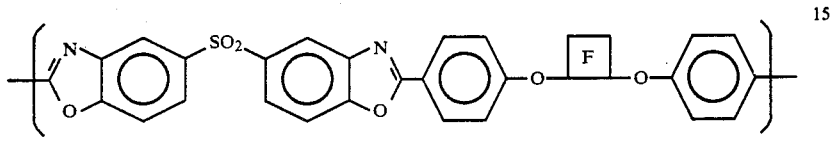

It has an inherent viscosity of 1.60 dL/g and a glass transition temperature at about 260° C. as measured by DSC.

EXAMPLE 7

The process of Example 5 is repeated using 1.00 g of bis-(3-amino-4-hydroxyphenyl)sulfone hydrochloride monohydrate, 1.27 g of 1,2-bis-(oxy-3-benzoylchloride) perfluorooyclobutane, 30.3 g of polyphosphoric acid (77.1 weight percent $P_2O_5$), 20.2 g of $P_2O_5$ and 5.6 g of tetramethylene sulfone. The polymer has an inherent viscosity of 0.39 dL/g and a glass transition temperature of about 192° C. as measured by DSC. The polymer contains mer units represented by the Formula

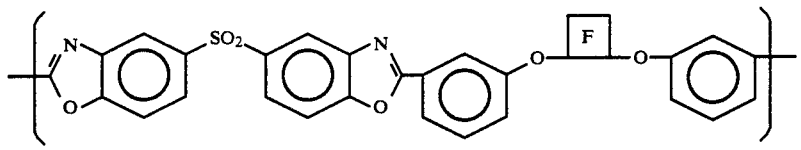

What is claimed is:

1. A polybenzazole polymer containing perfluorocyclobutane rings in the polymer backbone.

2. The polybenzazole polymer of claim 1 wherein essentially each perfluorocyclobutane ring is bonded to two oxygen or sulfur atoms bonded to different carbon atoms of the perfluorocyclobutane ring, which link the perfluorocyclobutane ring with the remainder of the polymer.

3. The polybenzazole polymer of claim 2 wherein each mer unit which contains a perfluorocyclobutane ring is represented by the following Formula:

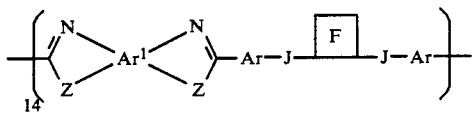

wherein
each Z represents —O—, —S— or —NR— wherein each R is independently a hydrogen atom, a $C_1$—$C_6$ alkyl group or an aromatic group:
each Ar and $Ar^1$ independently represents a di- or tetrafunctional aromatic group containing no more than about 18 carbon atoms: each J independently represents an oxygen atom or a sulfur atom: and
the F in each cyclobutane moiety indicates that it is perfluorinated.

4. The polybenzazole polymer of claim 3 wherein the polybenzazole polymer is a polybenzimidazole polymer or copolymer.

5. The polybenzazole polymer of claim 3 wherein the polybenzazole polymer is a polybenzoxazole polymer or a polybenzothiazole polymer or a copolymer of those polymers.

6. The polybenzazole polymer of claim 5 wherein each aromatic group (Ar) is a carbocyclic group containing no more than about 12 carbon atoms, and wherein each oxygen or sulfur atom (J) is an oxygen atom.

7. The polybenzazole polymer of claim 6 wherein each mer unit which contains a perfluorocyclobutane ring is represented by the following Formula:

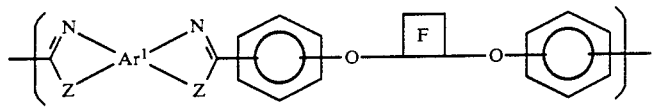

8. The polybenzazole polymer of claim 7 wherein at least some mer units which contain a perfluorocyclobutane ring are represented by the following Formula:

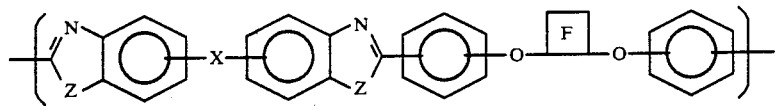

wherein X is a bond, or X is an oxygen atom, a sulfonyl group, a carbonyl group; an alkyl group or a perfluorinated alkyl group.

9. The polybenzazole polymer of claim 8 wherien X is a sulfonyl group.

10. The polybenzazole polymer of claim 9 wherein each Z is an oxygen atom and is para to X.

11. The polybenzazole polymer of claim 7 wherein each oxygen atom linking a perfluorocyclobutane ring to a phenylene group is bonded to the phenylene group in meta or para position with respect to the bond to an azole ring.

12. The polybenzazole polymer of cliam 11 wherein Ar¹ is a 1,2,4,5-phenylene moiety.

13. The polybenzazole polymer of claim 1 wherein each mer unit which contains a perfluorolobutane ring is represented by the following Formula:

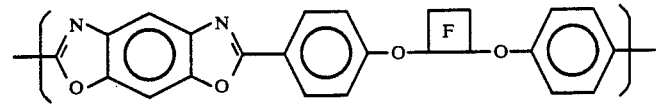

14. The polybenzazole polymer of claim 1 wherein each mer unit which contains a perfluorocyclobutane ring is represented by the following Formula

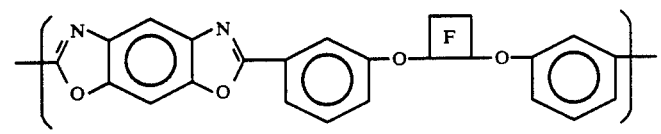

15. The polybenzazole polymer of claim 1 wherein each mer unit which contains a perfluoroyclobutane ring is represented by the following Formula:

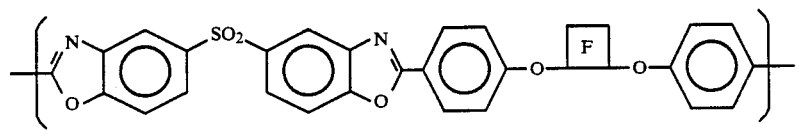

16. The polybenzazole polymer of claim 1 wherein each mer unit which contains a perfluorocyclobutane ring is represented by the following Formula:

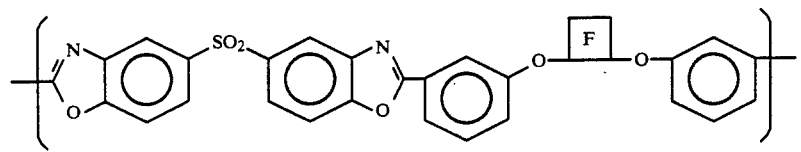

17. The polybenzazole polymer of claim 11 which also contains Ab[-PBZ] mer units represented by the following Formula:

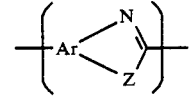

wherein:
each Ar is an aromatic group,
and each Z is independently an oxygen atom, a sulfur atom, or a nitrogen atom that is bonded to a hydrogen atom or an organic moiety which is stable and inert in acid under polymerization conditions.

18. The polybenzazole polymer of claim 11 which consists essentially of AA/BB[-PBZ]mer units represented by the following Formula:

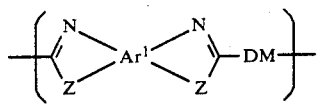

wherein:
each Ar is an aromatic group,

DM is a divalent organic moiety which is stable and inert in acid under polymerization conditions, and
each Z is independently an oxygen atom, a sulfur atom, or a nitrogen atom that is bonded to a hydrogen atom or an organic moiety which is stable and inert in acid under polymerization conditions.

19. The polybenzazole polymer of claim 11 which further contains mer units that do not contain a perfluorocyclobutane ring.

20. The polybenzazole polymer of claim 11 which consists essentially of mer units which contain perfluorocyclobutane rings.

* * * * *

UNITED STATES PATENT AND TRADEMARK OFFICE
CERTIFICATE OF CORRECTION

PATENT NO. : 5,091,500
DATED : February 25, 1992
INVENTOR(S) : Zenon Lysenko and William J. Harris, both of Midland, Michigan It is certified that error appears in the above-identified patent and that said Letters Patent is hereby corrected as shown below:   On the title page: Item [54] and Column 1, line 1, delete " POLYMER " and insert -- POLYMERS --.

Column 12, lines 10 through 15, delete

" 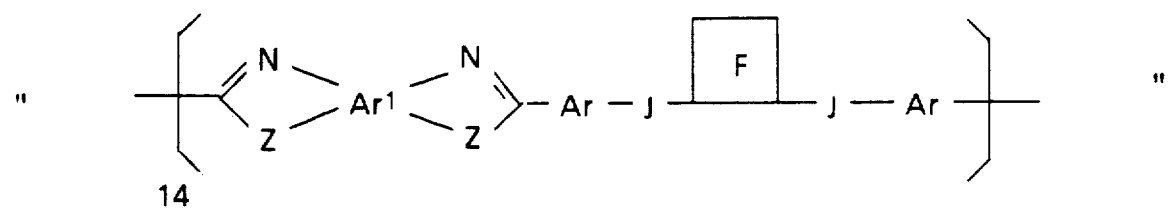 "

and insert

-- 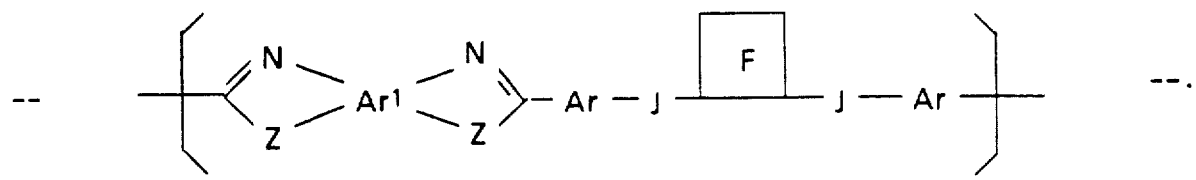 --.

UNITED STATES PATENT AND TRADEMARK OFFICE
CERTIFICATE OF CORRECTION

PATENT NO. : 5,091,500

DATED : February 25, 1992

INVENTOR(S) : Zenon Lysenko and William J. Harris, both of Midland, Michigan

It is certified that error appears in the above-identified patent and that said Letters Patent is hereby corrected as shown below:

Column 12, line 26, delete " aromatic group: " and insert -- aromatic group; --.

Column 12, line 40, delete " atom: " and insert -- atom; --.

Column 13, line 37, delete " wherien " and insert -- wherein --.

Column 13, line 46, delete " cliam " and insert -- claim --.

Column 13, line 49, delete " perfluorolobutane " and insert -- perfluorocyclobutane --.

Column 13, lines 62 through 65, delete

" 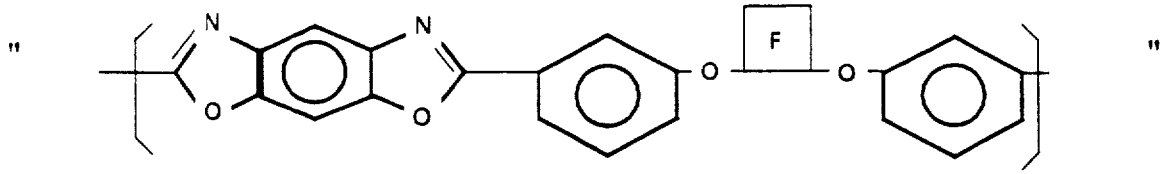 "

and insert

-- 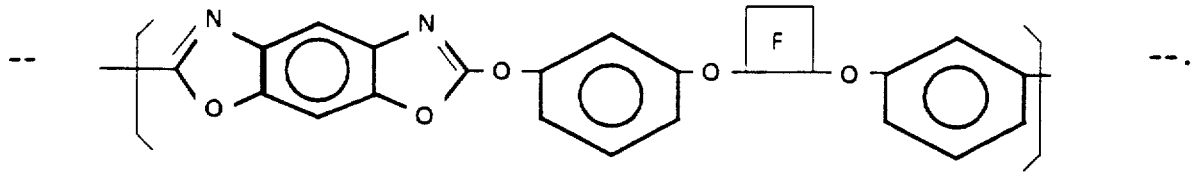 --.

UNITED STATES PATENT AND TRADEMARK OFFICE
CERTIFICATE OF CORRECTION

PATENT NO.   : 5,091,500

DATED       : February 25, 1992

INVENTOR(S) : Zenon Lysenko and William J. Harris, both of Midland, Michigan

It is certified that error appears in the above-identified patent and that said Letters Patent is hereby corrected as shown below:

Column 14, line 48, delete " Ab[-PBZ] " and insert -- AB[-PBZ] --.

Signed and Sealed this

Twenty-sixth Day of October, 1993

Attest:

Attesting Officer

BRUCE LEHMAN

Commissioner of Patents and Trademarks